(12) United States Patent
Chin

(10) Patent No.: US 10,278,278 B2
(45) Date of Patent: Apr. 30, 2019

(54) CIRCUIT STRUCTURE

(71) Applicants: AutoNetworks Technologies, Ltd., Yokkaichi, Mie (JP); Sumitomo Wiring Systems, Ltd, Yokkaichi, Mie (JP); SUMITOMO ELECTRIC INDUSTRIES, LTD, Osaka (JP)

(72) Inventor: Tou Chin, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 52 days.

(21) Appl. No.: 15/106,565

(22) PCT Filed: Dec. 15, 2014

(86) PCT No.: PCT/JP2014/083088
§ 371 (c)(1),
(2) Date: Jun. 20, 2016

(87) PCT Pub. No.: WO2015/093424
PCT Pub. Date: Jun. 25, 2015

(65) Prior Publication Data
US 2017/0318659 A1   Nov. 2, 2017

(30) Foreign Application Priority Data
Dec. 20, 2013 (JP) ................... 2013-263268

(51) Int. Cl.
*H05K 1/02* (2006.01)
*H05K 1/18* (2006.01)
*H05K 7/20* (2006.01)

(52) U.S. Cl.
CPC ........... *H05K 1/0204* (2013.01); *H05K 1/181* (2013.01); *H05K 7/209* (2013.01);
(Continued)

(58) Field of Classification Search
CPC ................. H05K 1/0204; H05K 1/181; H05K 2201/066; H05K 2201/10053; H05K 2201/10409; H05K 2201/09063
See application file for complete search history.

(56) References Cited

U.S. PATENT DOCUMENTS 6,714,414 B1 * 3/2004 Dubovsky ........... H01L 23/4006
165/185
6,771,505 B2 * 8/2004 Thyzel .................. H05K 1/056
174/252
(Continued)

FOREIGN PATENT DOCUMENTS

| JP | 2005151617 A | 6/2005 |
| JP | 2007202367 A | 8/2007 |
| JP | 2011-172413 A | 9/2011 |

*Primary Examiner* — Ishwarbhai B Patel
(74) *Attorney, Agent, or Firm* — Honigman LLP

(57) ABSTRACT

A circuit structure includes an electronic component, a circuit board having a conductive path, the electronic component being mounted on the circuit board, a heat dissipation member on top of which the circuit board is placed and which dissipates heat of the circuit board, a sheet-like spacer sheet provided in a predetermined region between the circuit board and the heat dissipation member, and a bonding portion for bonding the circuit board and the heat dissipation member to each other, the bonding portion having adhesive properties or tackiness and being provided in a region between the circuit board and the heat dissipation member where the spacer sheet is not provided.

10 Claims, 17 Drawing Sheets

(52) U.S. Cl.
CPC ... *H05K 7/20472* (2013.01); *H05K 2201/066* (2013.01); *H05K 2201/09063* (2013.01); *H05K 2201/10053* (2013.01); *H05K 2201/10409* (2013.01)

(56) References Cited

U.S. PATENT DOCUMENTS

| | | | | |
|---|---|---|---|---|
| 7,800,220 | B2* | 9/2010 | Marz | H01L 23/473 |
| | | | | 165/104.33 |
| 7,983,048 | B2* | 7/2011 | Sasaki | H01L 23/3677 |
| | | | | 165/104.33 |
| 2003/0137813 | A1* | 7/2003 | Onizuka | H05K 1/0263 |
| | | | | 361/777 |
| 2005/0099778 | A1 | 5/2005 | Nakanishi | |
| 2011/0194255 | A1* | 8/2011 | Yamashita | B23K 1/0016 |
| | | | | 361/711 |

\* cited by examiner

CIRCUIT STRUCTURE

CROSS-REFERENCE TO RELATED APPLICATIONS

This application is the U.S. National Phase of PCT/JP2014/083088 filed Dec. 15, 2014, which claims priority of Japanese Patent Application No. 2013-263268 filed Dec. 20, 2013.

TECHNICAL FIELD

The present invention relates to a circuit structure.

BACKGROUND

Conventionally, a circuit structure in which a circuit board and a heat dissipation member for dissipating heat of the circuit board to the outside are placed one on top of the other has been known. In this type of circuit structure, the circuit board is bonded onto the heat dissipation member using an adhesive.

According to a circuit structure disclosed in JP 2005-151617A, when a sheet-like element made by braiding or weaving insulating fibers into a sheet-like shape is placed on top of an adhesive applied onto a heat dissipation member, the adhesive substantially uniformly permeates the entire sheet-like element. A circuit section is placed on top of this sheet-like element, the circuit section is pressed against the heat dissipation member, and thus the circuit section is fixed onto the heat dissipation member.

SUMMARY

In JP 2005-151617A, when fixing the circuit section onto the heat dissipation plate, the circuit section is pressed against the heat dissipation member. However, when pressing the circuit section, it is not easy to press the entire surface of the circuit body with a uniform force. Therefore, the pressure applied to the adhesive via the circuit section is not uniform, and the adhesion of the adhesive may be insufficient at some locations. There is concern that separation of the circuit section from the heat dissipation member may occur in locations where the adhesion of the adhesive is insufficient.

The present invention was made based on the above-described circumstances, and it is an object thereof to suppress poor bonding between a circuit board and a heat dissipation member.

A circuit structure of the present invention includes an electronic component, a circuit board having a conductive path, the electronic component being mounted on the circuit board, a heat dissipation member on top of which the circuit board is placed and which dissipates heat of the circuit board, a sheet-like spacer sheet provided in a predetermined region between the circuit board and the heat dissipation member, and a bonding portion for bonding the circuit board and the heat dissipation member to each other, the bonding portion having adhesive properties or tackiness (pressure-sensitive adhesive properties) and being provided in a region between the circuit board and the heat dissipation member where the spacer sheet is not provided.

With this configuration, even if the circuit board is pressed against the heat dissipation member during bonding of the circuit board and the heat dissipation member to each other, the dimension between the circuit board and the heat dissipation member is kept at the thickness dimension of the spacer sheet. Thus, the pressure applied to the bonding portion between the circuit board and the heat dissipation member is made uniform, and therefore poor bonding between the circuit board and the heat dissipation member can be suppressed.

Preferably, the circuit structure has the following configurations in addition to the above-described configuration. A through-hole may be formed in the spacer sheet, and the bonding portion may be provided within the through-hole. With this configuration, a hole wall of the through-hole surrounds the bonding portion, and thus an adhesive or a pressure-sensitive adhesive of the bonding portion can be prevented from leaking to the outside.

The electronic component may be mounted in the region of the bonding portion on the circuit board. With this configuration, heat of the electronic component can be dissipated by the heat dissipation member via the bonding portion within the through-hole.

The bonding portion may be a thermally conductive sheet. The heat dissipation member may be provided with a fitting recess into which the spacer sheet is fitted. With these configurations, the spacer sheet can be easily disposed at a predetermined position.

The spacer sheet may be provided in a peripheral portion of a region where the circuit board and the heat dissipation member overlap.

The circuit board and the heat dissipation member may be fixed to each other by fastening with a screw, and an insertion hole into which the screw may be inserted is formed in the spacer sheet so as to pass through the spacer sheet. With these configurations, a force generated during fastening by screwing can be received by the spacer sheet.

According to the present invention, it is possible to suppress poor bonding between a circuit board and a heat dissipation member.

DETAILED DESCRIPTION

Figure 1:
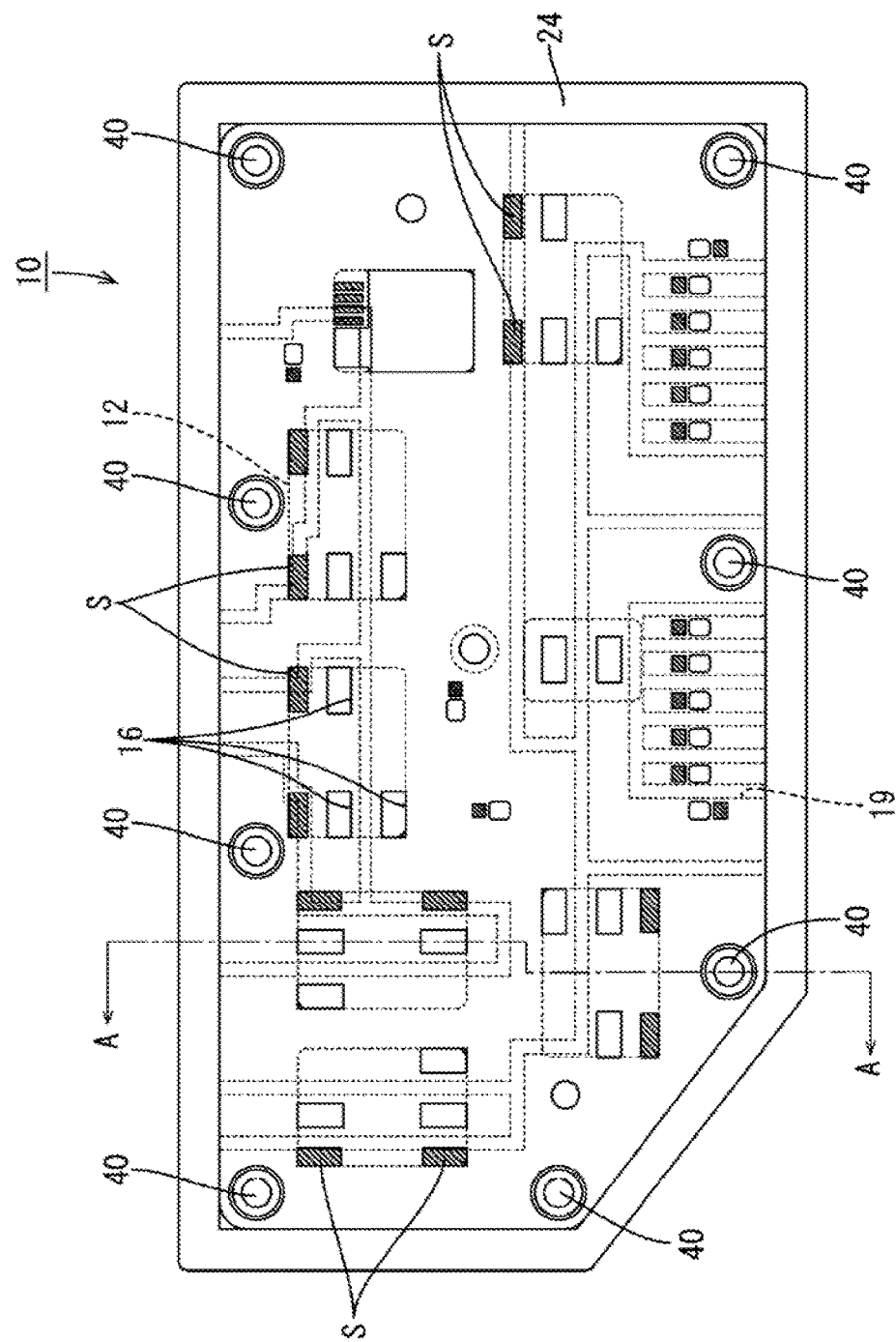
FIG. 1 is a plan view showing a circuit structure of Embodiment 1.

A first embodiment will be described with reference to FIGS. 1 to 8. A circuit structure 10 is provided on a power supply path between a power source such as a battery or the like of a vehicle, for example, and a load constituted by in-vehicle electrical equipment, such as a lamp or a wiper, and the like, and can be used for a DC-DC converter, an inverter, or the like, for example. In the following description, the vertical direction in FIG. 2 is used as the reference vertical direction, and the lower side and the upper side in FIG. 1 are regarded as the front side and the rear side, respectively.

Circuit Structure 10

Figure 2:
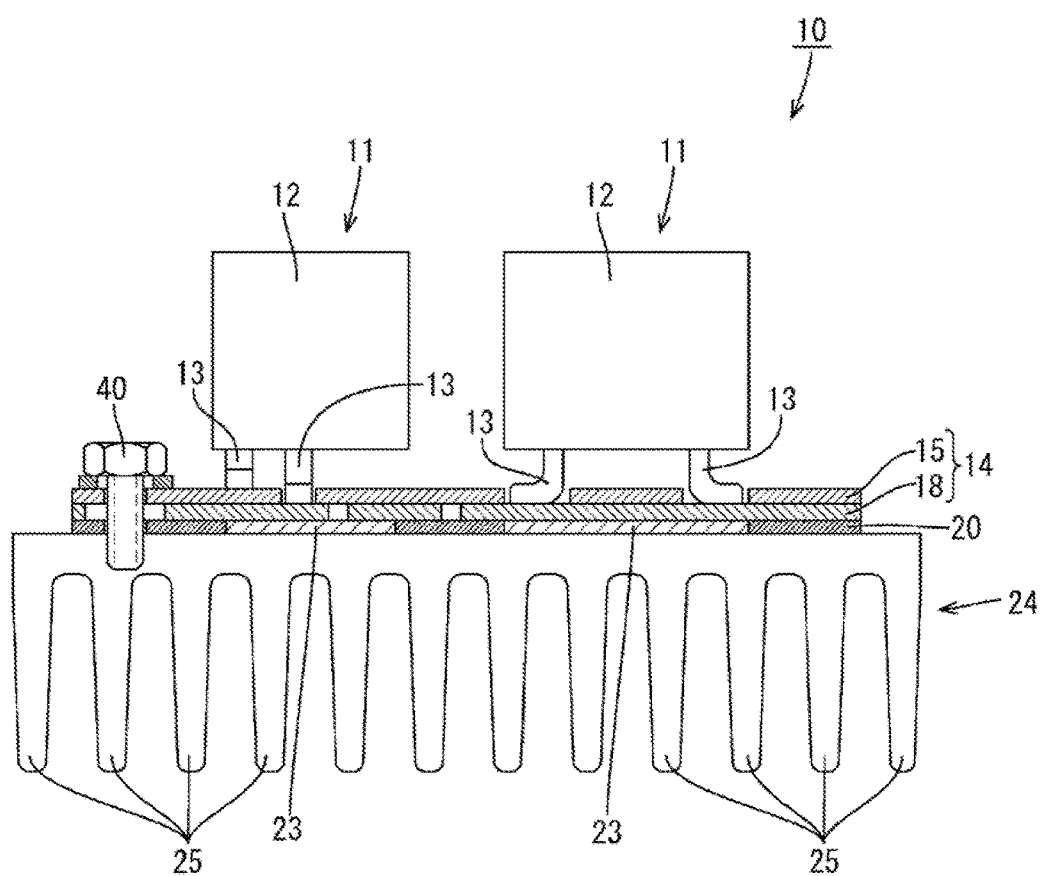
FIG. 2 is a cross-sectional view taken along arrows A-A in FIG. 1.

As shown in FIG. 2, the circuit structure 10 includes electronic components 11, a circuit board 14 on which the electronic components 11 are mounted, a heat dissipation member 24 on top of which the circuit board 14 is placed and which dissipates heat of the circuit board 14, a sheet-like spacer sheet 20 provided between the circuit board 14 and the heat dissipation member 24, and bonding portions 23 for bonding the circuit board 14 and the heat dissipation member 24 to each other, the bonding portions 23 being provided in those regions between the circuit board 14 and the heat dissipation member 24 that are different from a region where the spacer sheet 20 is provided.

Electronic Components 11

Each of the electronic components 11 is constituted by a switching element such as a relay, for example, and has a box-shaped main body 12 and a plurality of lead terminals 13. The main body 12 has a rectangular parallelepiped shape, with the lead terminals 13 protruding from a bottom surface thereof. The plurality of lead terminals 13 are connected to a conductive path of the circuit board 14 by reflow soldering. It should be noted that in FIGS. 1 and 5, the electronic components 11 are omitted from these diagrams, and connecting portions S where the lead terminals 13 are connected to the conductive path of a printed wiring board 15 are indicated by hatching.

Circuit Board 14

Figure 3:
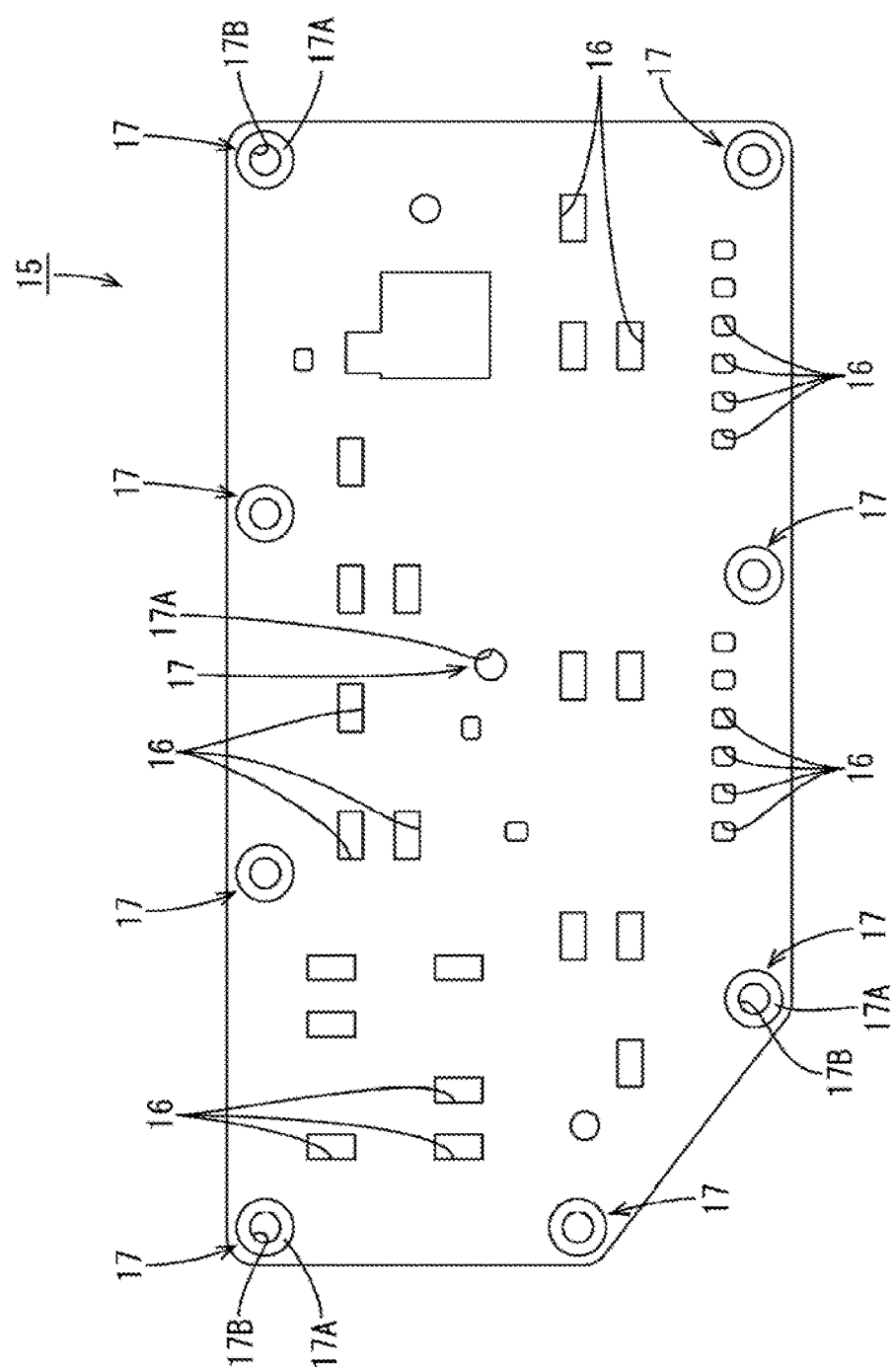
FIG. 3 is a plan view showing a printed wiring board.

The circuit board 14 has a rectangular shape in which one of the corner portions has been cut away, and is formed by bonding the printed wiring board 15 and a busbar 18 to each other using an adhesive member or the like (e.g., an adhesive sheet, an adhesive, or the like). The printed wiring board 15 is formed by printing a conductive path (not shown) made of copper foil or the like onto an insulating board made of an insulating material. In this printed wiring board 15, as shown in FIG. 3, through-holes 16 for connecting the lead terminals 13, the main body 12, and other terminals (not shown) of each electronic component 11 to the busbar 18 as well as fastening portions 17 for fastening with screws 40 are formed.

The through-holes 16 have rectangular shapes and are arranged in accordance with the positions of the electronic components 11. The fastening portions 17 are provided in a central portion and a peripheral portion of the circuit board 14, and circular insertion holes 17A into which shaft portions of the screws 40 are inserted are formed in the fastening portions 17. A washer 17B is provided in an upper portion of each of the fastening portions 17 located in the peripheral portion of the circuit board 14, the washer 17B protruding from the upper surface of the printed wiring board 15 while having a ring shape. The washer 17B is fixed to the upper surface of the printed wiring board 15 by adhesion or the like. It should be noted that in the present embodiment, the screws 40 passing through the washers 17B and the insertion holes 17A are screwed into screw holes 39 of the heat dissipation member 24; however, in another embodiment, a configuration may also be adopted in which, for example, the circuit board 14 and the heat dissipation member 24 are fixed to each other by screwing using nuts or the like, which are not shown.

Figure 4:
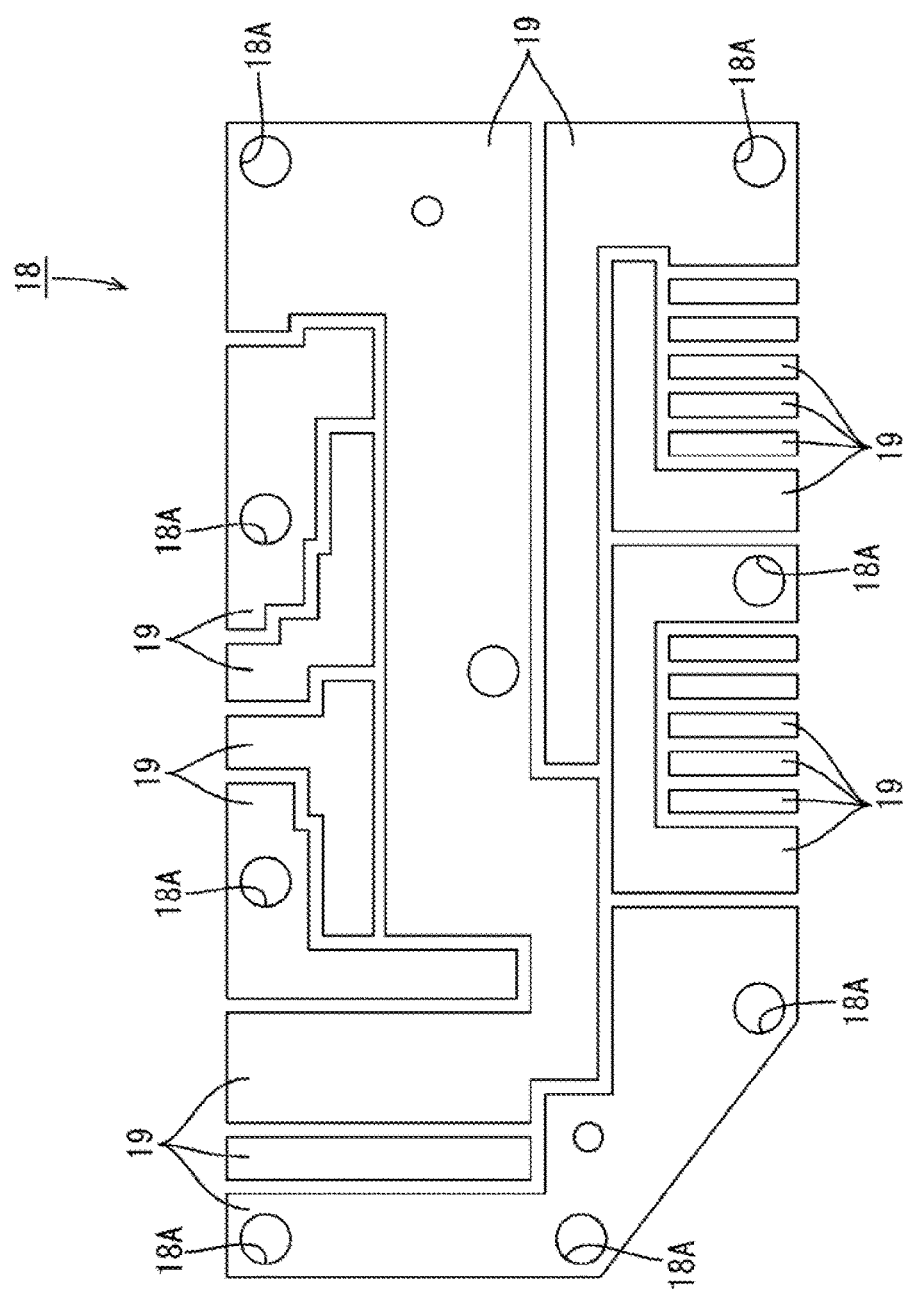
FIG. 4 is a plan view showing a busbar.

As shown in FIG. 4, the busbar 18 is constituted by a plurality of plate-shaped split members 19 formed by punching a metal plate material made of copper, a copper alloy, or the like into the shape of the conductive paths, and the plurality of split members 19 are arranged in the same plane. A plurality of circular insertion holes 18A into which the shaft portions of the screws 40 are inserted are formed in the busbar 18. It should be noted that in the present embodiment, a lead terminal 13 of an electronic component 11 is soldered to the conductive path of the printed wiring board 15, and another lead terminal 13 of the same electronic component 11 is soldered to the busbar 18 (see FIG. 2).

Spacer Sheet 20

Figure 6:
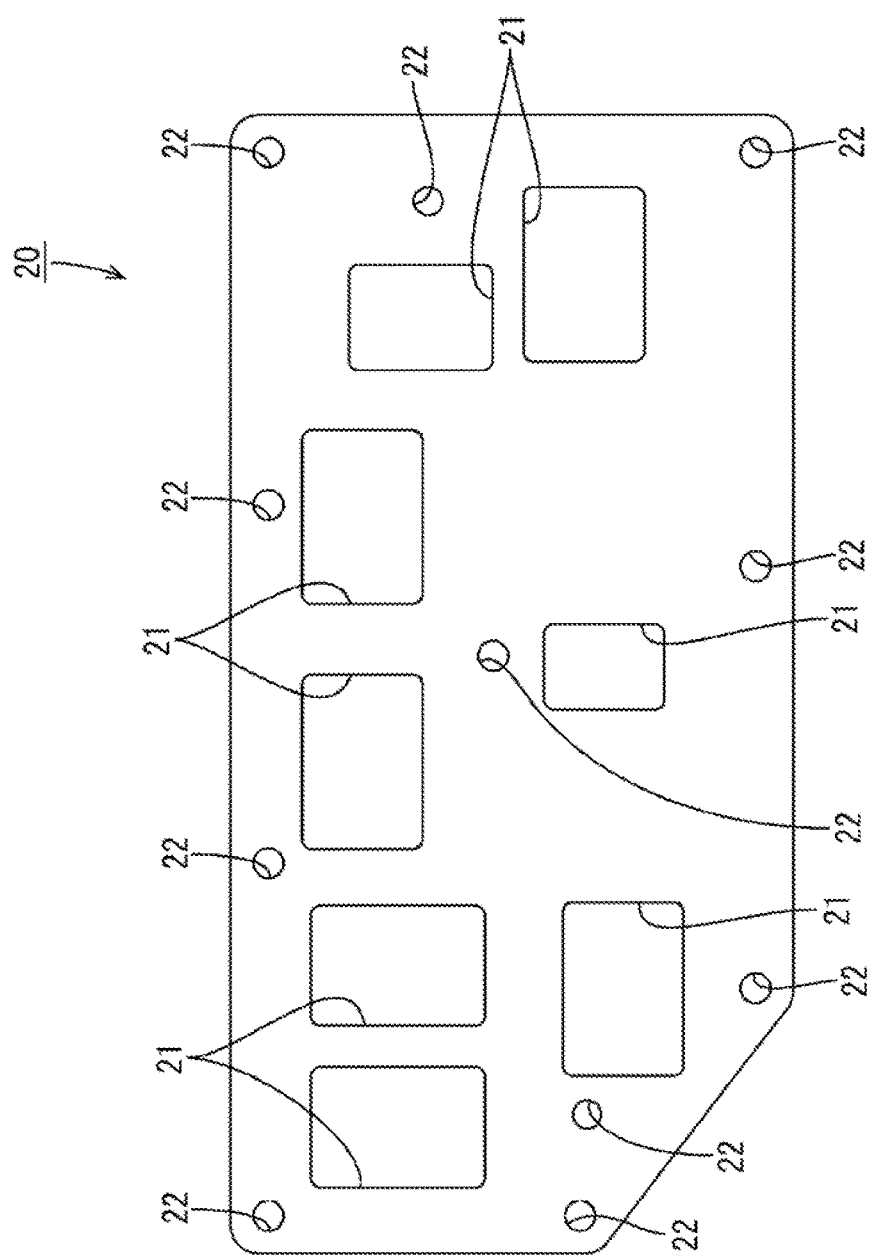
FIG. 6 is a plan view showing a spacer sheet.

As shown in FIG. 6, the spacer sheet 20 has a rectangular shape in which one of the corner portions has been cut away. A material having such a strength that does not allow the spacer sheet 20 to deform under a pressing force applied during bonding of the circuit board 14 or a force applied during fastening by screwing is used for the spacer sheet 20. In the present embodiment, the spacer sheet 20 is a sheet-like product made of plastic (synthetic resin) and having a thickness smaller than the thickness of the circuit board 14.

In the spacer sheet 20, accommodation holes 21 having rectangular shapes respectively corresponding to the shapes of bottom surfaces of the main bodies 12 of the electronic components 11 and insertion holes 22 into which the shaft portions of the screws 40 are inserted are formed. The accommodation holes 21 and the insertion holes 22 are through-holes. That is to say, the spacer sheet 20 is provided in a region (predetermined region) that is outside the through-holes (accommodation holes 21 and insertion holes 22), of a region where the circuit board 14 and the heat dissipation member 24 overlap.

Bonding Portions 23

Figure 8:
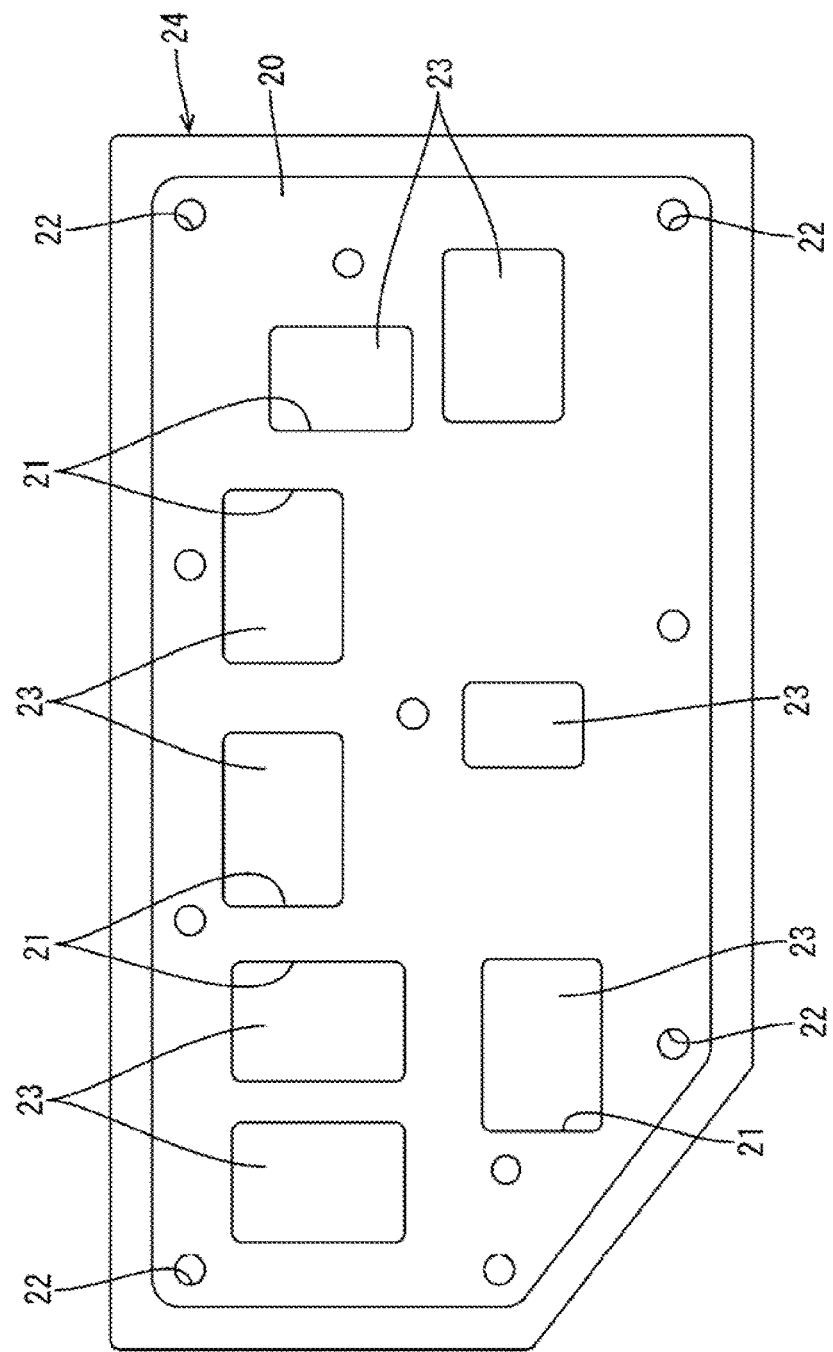
FIG. 8 is a plan view showing a state in which the spacer sheet and bonding portions are placed on the heat dissipation member.

As shown in FIG. 8, the bonding portions 23 are sheet-like members having adhesive properties and are provided in the accommodation holes 21 (regions where the spacer sheet 20 is not provided) between the circuit board 14 and the heat dissipation member 24. The shapes of the bonding portions 23 are approximately the same as or slightly smaller than the shapes of the corresponding accommodation holes 21 of the spacer sheet 20. Thus, the bonding portions 23 have shapes corresponding to the shapes of the bottom surfaces of the main bodies 12 of the electronic components 11 (shapes obtained by orthographic projection of the electronic components 11 in a direction orthogonal to the circuit board 14). For example, a product obtained by applying an adhesive having insulating properties to both surfaces of a synthetic resin film having insulating properties can be used for the bonding portions 23. In the present embodiment, for example, a two-part adhesive that sets at normal temperature can be used as the adhesive.

Heat Dissipation Member 24

Figure 7:
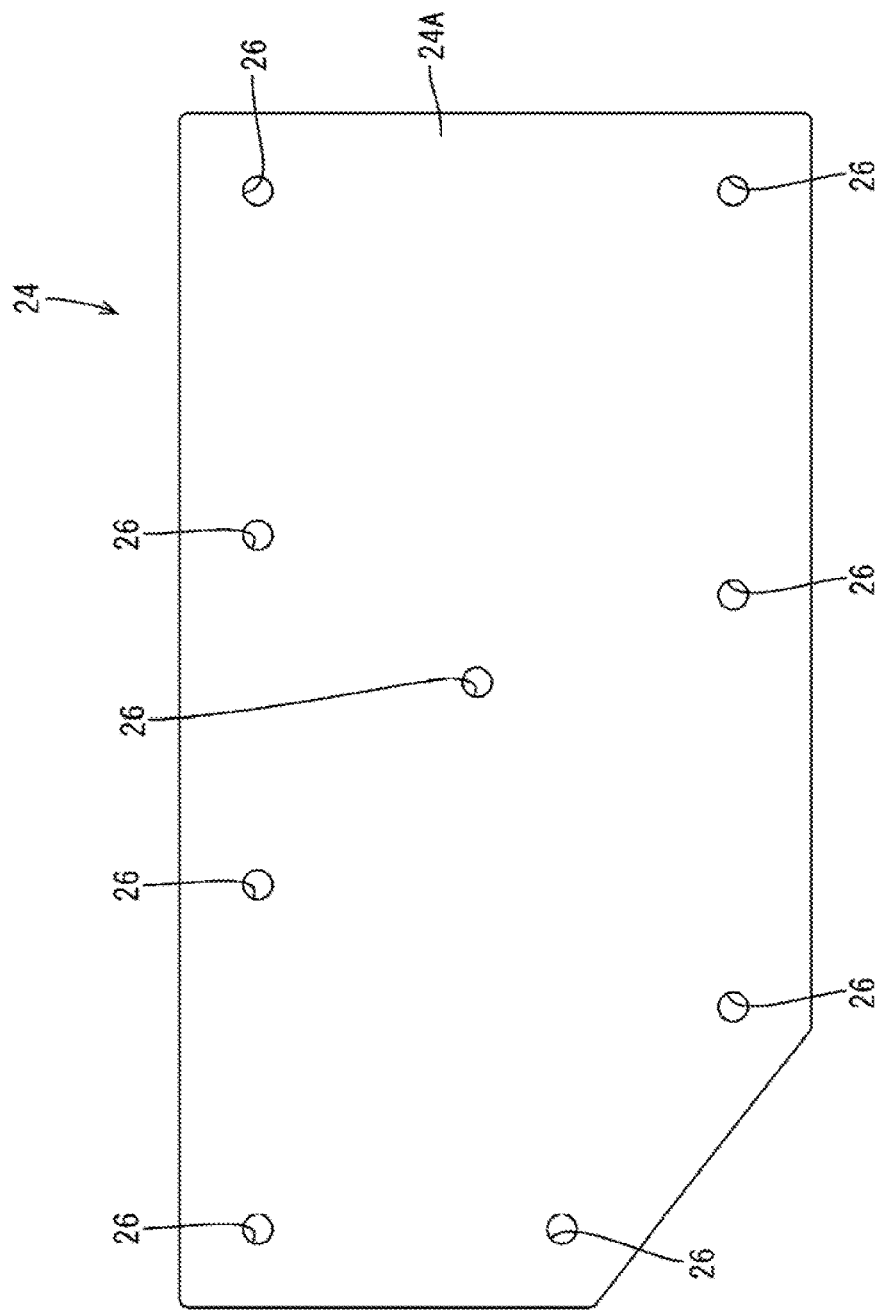
FIG. 7 is a plan view showing a heat dissipation member.

The heat dissipation member 24 is made of a metal material having high thermal conductivity, such as an aluminum alloy or a copper alloy. As shown in FIG. 7, the heat dissipation member 24 has a flat upper surface 24A corresponding to the shape of the circuit board 14, and also has a plurality of heat dissipation fins 25 that are provided on a bottom surface side of the heat dissipation member 24, lined up like the teeth of a comb. In the heat dissipation member 24, a plurality of screw holes 26 for fastening the circuit board 14 by screwing are formed.

Figure 5:
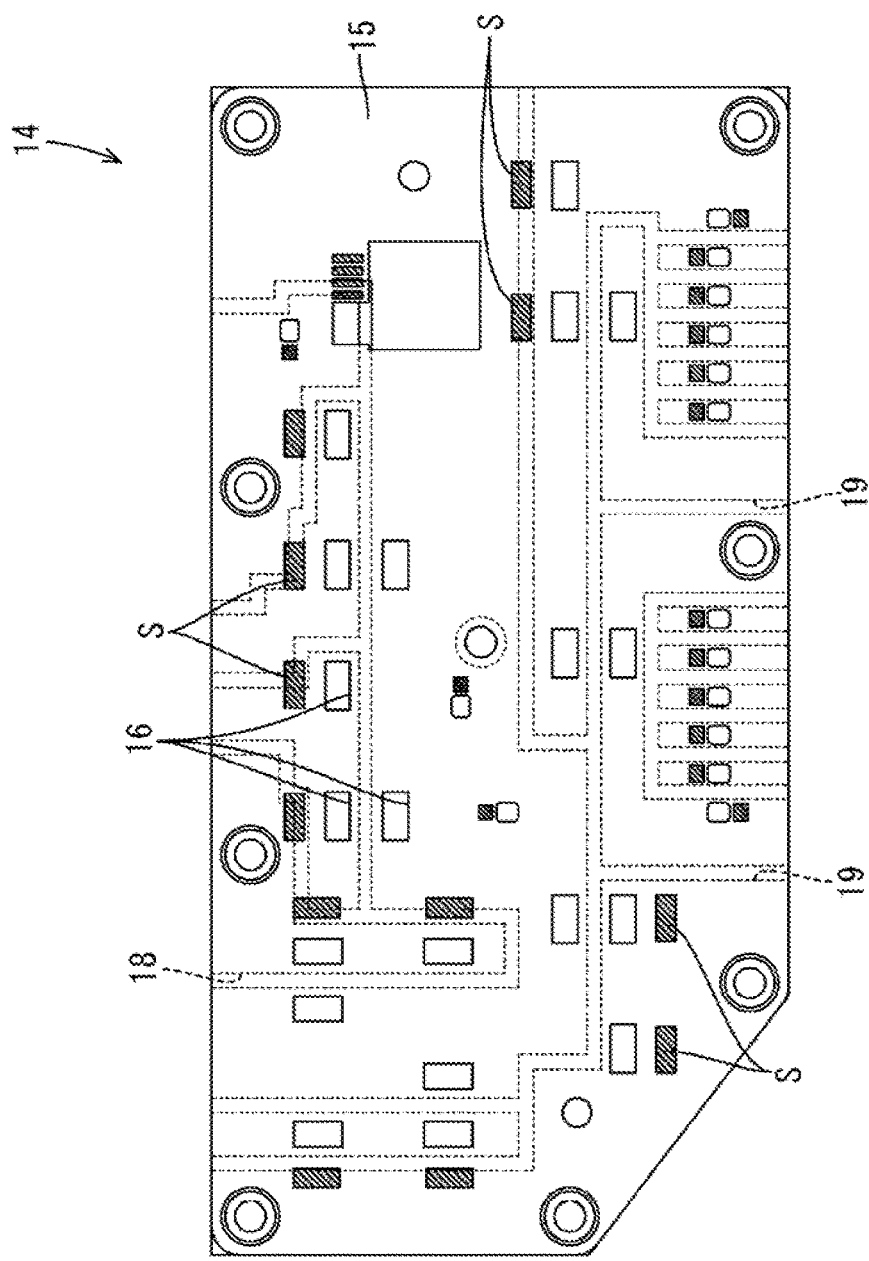
FIG. 5 is a plan view showing a state in which electronic components are mounted on a circuit board.

Now, a method for manufacturing the circuit structure 10 will be described. The circuit board 14 is formed by bonding the printed wiring board 15 and the busbar 18 to each other using an adhesive member. Then, the electronic components 11 and the like are mounted on the circuit board 14 by reflow soldering, which is performed by applying a solder paste between the conductive path of the circuit board 14 and the lead terminals 13 of the electronic components 11 and to other terminals, which are not shown, and passing the resultant circuit board 14 through a reflow oven (FIG. 5).

Moreover, the spacer sheet 20 is set at a predetermined position on the upper surface of the heat dissipation member 24, and the bonding portions 23 are accommodated in the accommodation holes 21 of the spacer sheet 20 (FIG. 8). The circuit board 14 is placed on the spacer sheet 20 and the bonding portions 23, and the circuit board 14 is fixed to the heat dissipation member 24 by screwing the screws 40 into the fastening portions 17. Thus, the circuit structure 10 is formed.

In this state, the electronic components 11 are provided on the bonding portions 23 via the circuit board 14, and heat that is generated during energization of the electronic components 11 can be transferred to the heat dissipation member 24 via the bonding portions 23 and dissipated to the outside from the heat dissipation member 24. The circuit structure 10 is accommodated in a case (not shown) and provided on the path from the power source of the vehicle to the load, as an electrical junction box (not shown).

According to the above-described embodiment, the following effects are achieved. The circuit structure 10 includes the electronic components 11, the circuit board 14 having the conductive path, the electronic components 11 being mounted on the circuit board 14, the heat dissipation member 24 on top of which the circuit board 14 is placed and which dissipates heat of the circuit board 14, the sheet-like spacer sheet 20 provided in a predetermined region between the circuit board 14 and the heat dissipation member 24, and the bonding portions 23 for bonding the circuit board 14 and the heat dissipation member 24 to each other, the bonding portions 23 having adhesive properties or tackiness and being provided in those regions between the circuit board 14 and the heat dissipation member 24 where the spacer sheet 20 is not provided.

According to the present embodiment, even if the circuit board 14 is pressed against the heat dissipation member 24 during bonding of the circuit board 14 and the heat dissipation member 24 to each other, the dimension between the circuit board 14 and the heat dissipation member 24 is kept at the thickness dimension of the spacer sheet 20. Thus, the pressure applied to the bonding portions 23 between the circuit board 14 and the heat dissipation member 24 can be uniformized, and therefore poor bonding between the circuit board 14 and the heat dissipation member 24 can be suppressed.

Moreover, the accommodation holes 21 (through-holes) are formed in the spacer sheet 20, and the bonding portions 23 are respectively provided in the accommodation holes 21. With this configuration, a hole wall of each accommodation hole 21 surrounds the corresponding bonding portion 23, and thus, the adhesive of the bonding portions 23 can be prevented from leaking to the outside.

Furthermore, the electronic components 11 are mounted in the regions of the bonding portions 23 on the circuit board 14. With this configuration, heat of the electronic components 11 can be dissipated by the heat dissipation member 24 via the bonding portions 23 within the accommodation holes 21 (through-holes).

Moreover, the circuit board 14 and the heat dissipation member 24 are fixed to each other by fastening with the screws 40, and the insertion holes 17A into which the screws 40 are inserted are formed in the spacer sheet 20 so as to pass through the spacer sheet 20. With this configuration, a force generated during fastening by screwing can be received by the spacer sheet 20.

Figure 9:
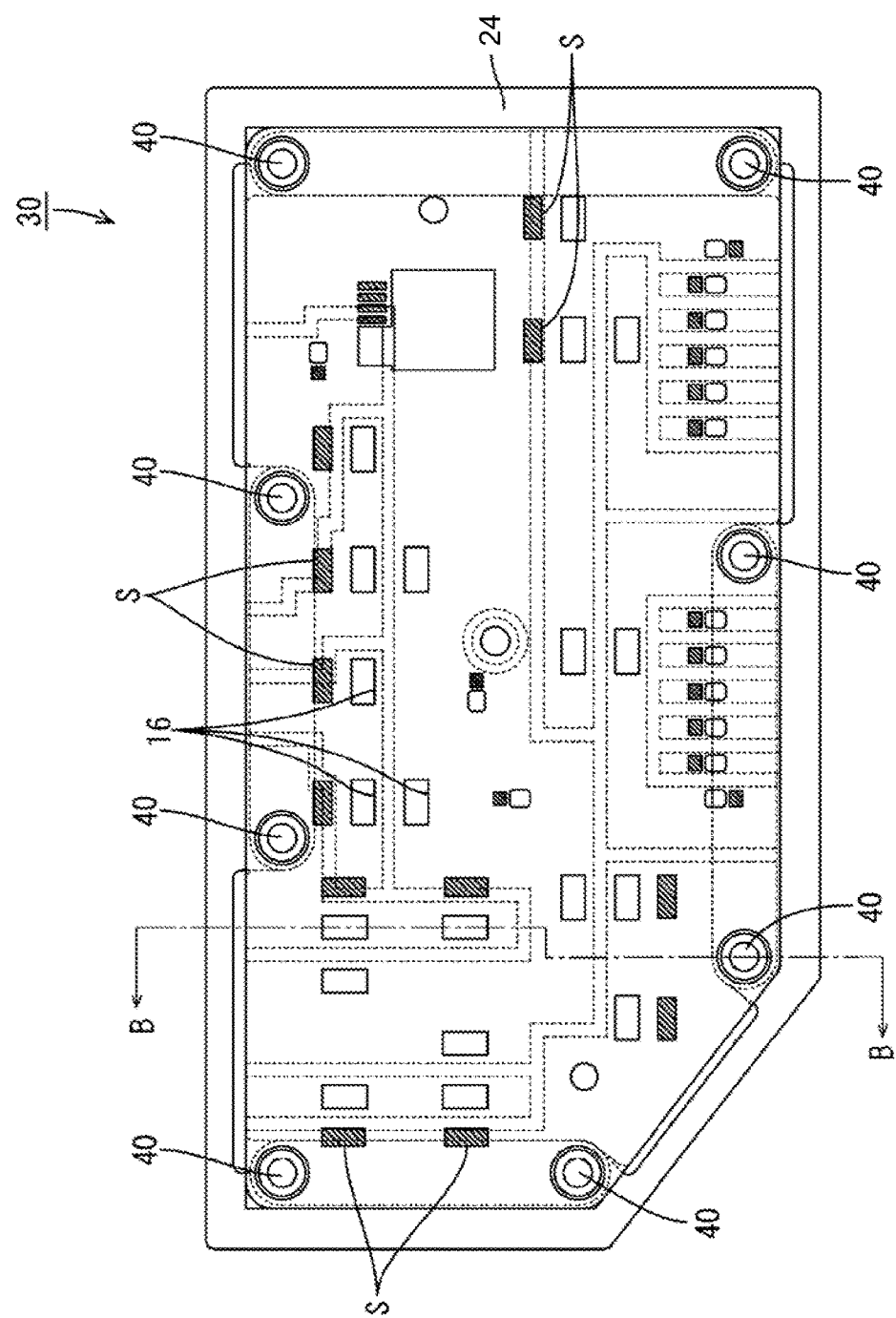
FIG. 9 is a plan view showing a circuit structure of Embodiment 2.
Figure 10:
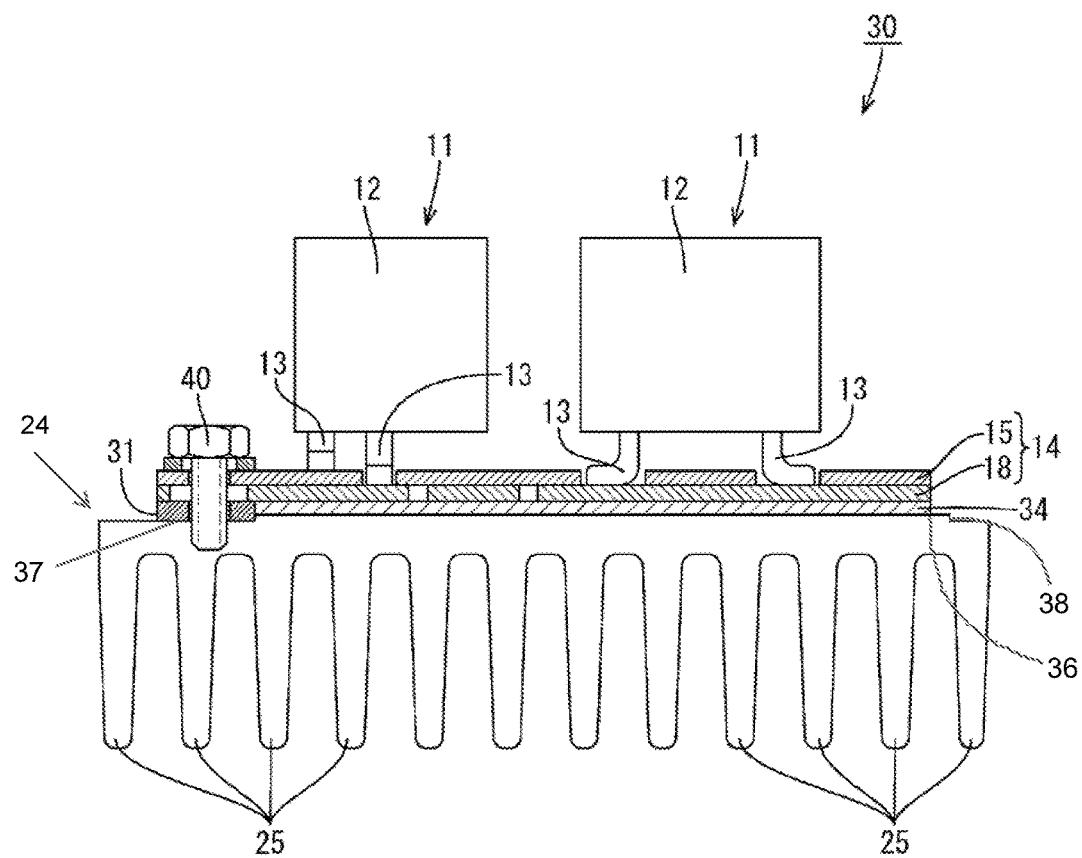
FIG. 10 is a cross-sectional view taken along arrows B-B in FIG. 9.

Next, Embodiment 2 will be described with reference to FIGS. 9 to 17. A circuit structure 30 of Embodiment 2 uses a spacer sheet 31 having a shape that is different from the shape of the spacer sheet 20 of Embodiment 1. Similar to Embodiment 1, the circuit structure 30 is provided on a power supply path between a power source such as a battery of a vehicle and a load constituted by in-vehicle electrical equipment, such as a lamp or a wiper, and the like, and can be used for a DC-DC converter, an inverter, or the like, for example. In the following description, the vertical direction in FIG. 10 is used as the reference vertical direction, and the lower side and the upper side in FIG. 9 are regarded as the front side and the rear side, respectively. Also, the same components as those of Embodiment 1 are denoted by the same reference numerals, and their description is omitted.

As shown in FIG. 10, the circuit structure 30 includes the electronic components 11, the circuit board 14 on which the electronic components 11 are mounted, a heat dissipation member 24 on top of which the circuit board 14 is placed and which dissipates heat of the circuit board 14, a sheet-like spacer sheet 31 provided between the circuit board 14 and the heat dissipation member 24, and a bonding portion 34 for bonding the circuit board 14 and the heat dissipation member 24 to each other, the bonding portion 34 being provided in a region between the circuit board 14 and the heat dissipation member 24 that is different from a region where the spacer sheet 31 is provided.

The electronic components 11 and the circuit board 14 (printed wiring board 15 and busbar 18) are the same as those of Embodiment 1. It should be noted that in FIG. 9, the electronic components 11 are omitted from the diagram, and the connecting portions S where the lead terminals 13 are connected to the conductive path of the circuit board 14 are indicated by hatching.

Spacer Sheet 31

The spacer sheet 31 is a sheet-like product made of plastic (synthetic resin) and having a thickness smaller than the thickness of the circuit board 14. A material having such a strength that does not allow the spacer sheet 31 to deform under the pressing force applied during bonding of the circuit board 14 or the force applied during fastening by screwing is used for the spacer sheet 31.

Figure 11:
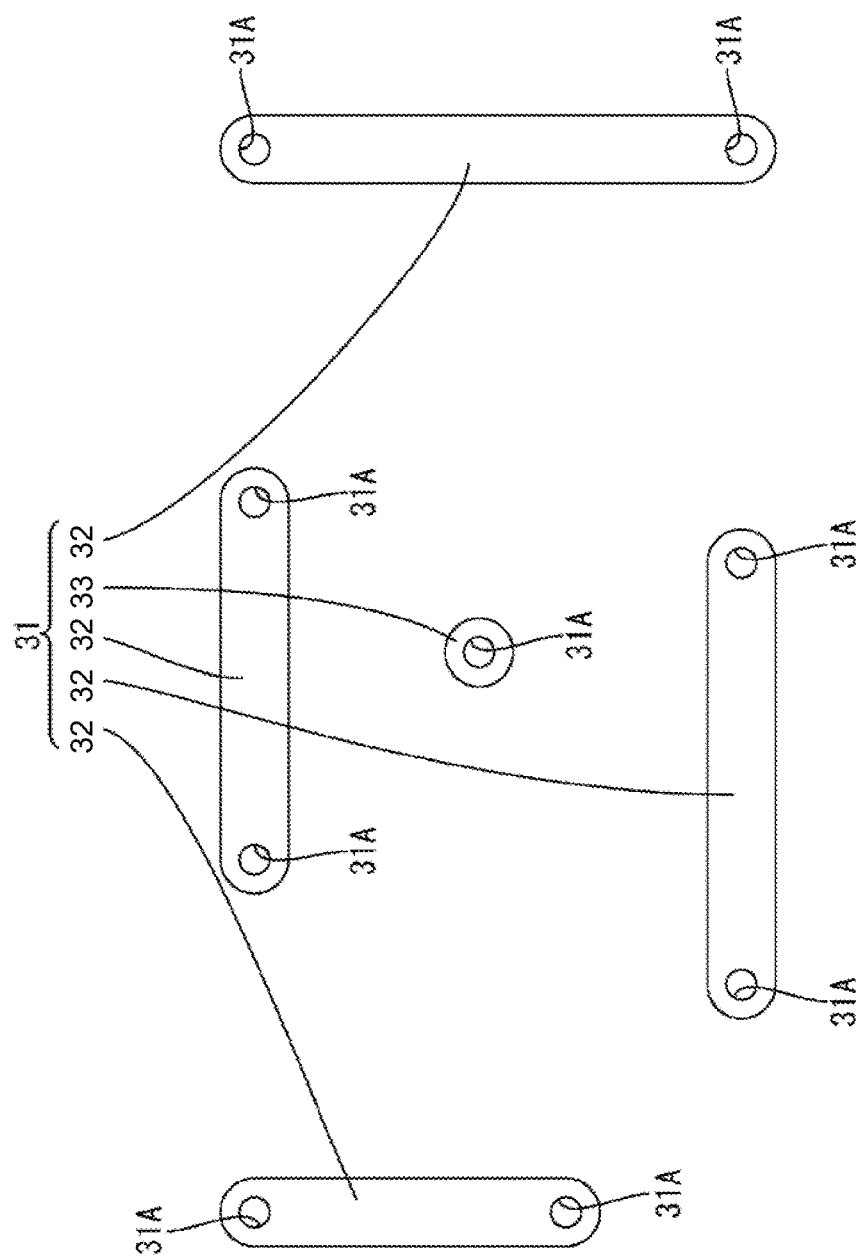
FIG. 11 is a plan view showing a spacer sheet.

As shown in FIG. 11, the spacer sheet 31 includes a plurality of first sheets 32 having elongated shapes and a second sheet 33 having a circular shape, and insertion holes 31A into which the shaft portions of the screws 40 are inserted are formed in the first sheets 32 and the second sheet 33. A plurality of insertion holes 31A are formed in each first sheet 32, while a single insertion hole 31A is formed in the second sheet 33. Each insertion hole 31A is a through-hole and has a circular shape having a size that allows the shaft portion of the screw 40 to be inserted into the insertion hole 31A with a minute gap clearance therebetween.

The first sheets 32 each have a length that allows two insertion holes 31A to be lined up therein, and the first sheets 32 each have a substantially uniform width dimension except for both end portions thereof. Both of the end portions of each first sheet 32 have a circular arc shape corresponding to the outer circumferential shape of a head portion of the screw 40. The second sheet 33 has a circular outer circumference, and the insertion hole 31A is formed in a central portion thereof. Portions around the individual insertion holes 31A of the spacer sheet 31 receive the pressure from the head portion side of the screws 40 during fastening by screwing.

Bonding Portion 34

Figure 12:
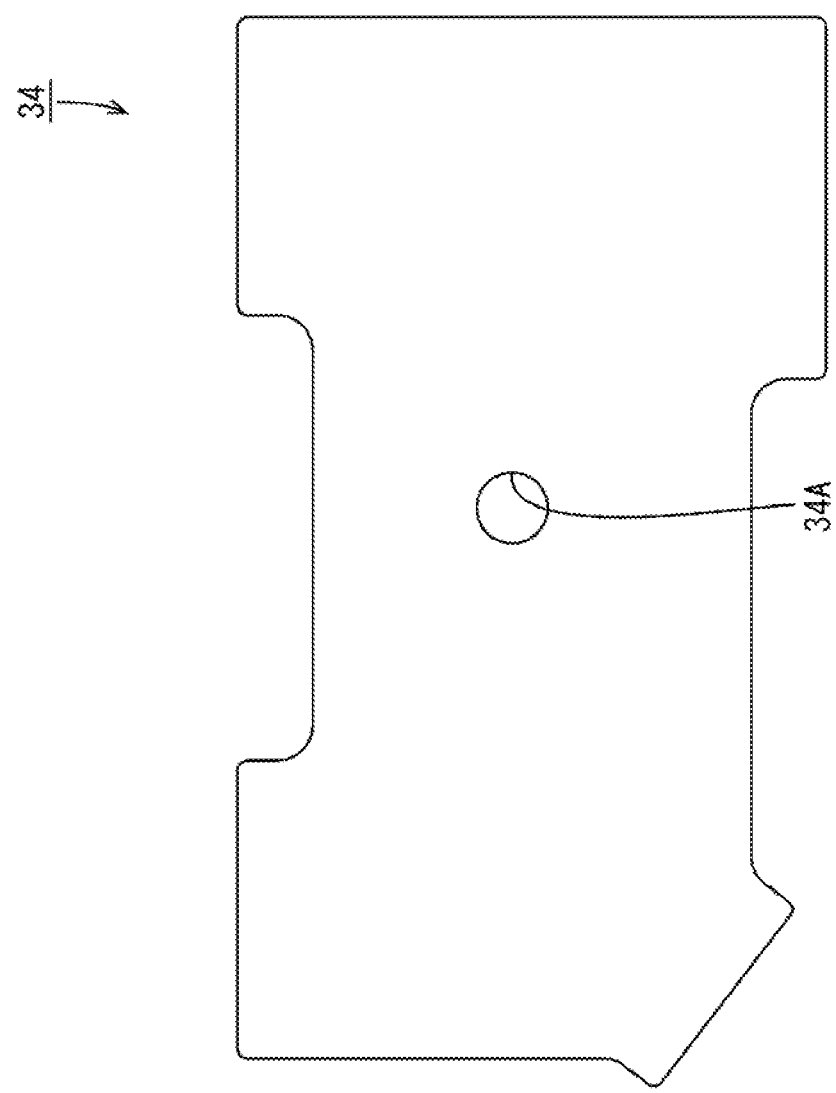
FIG. 12 is a plan view showing a bonding portion.

As shown in FIG. 12, the bonding portion 34 is a sheet-like adhesive member for bonding the circuit board 14 and the heat dissipation member 24 to each other, and is provided in a protruding region 36 of an upper surface of the heat dissipation member 24. For example, a product obtained by applying an adhesive having insulating properties to both surfaces of a synthetic resin film having insulating properties can be used as the bonding portion 34. A two-part adhesive that sets at normal temperature can be used as the adhesive.

The bonding portion 34 is provided in a region where the spacer sheet 31 is not provided, of a region between the circuit board 14 and the heat dissipation member 24 where the circuit board 14 and the heat dissipation member 24 overlap. An insertion hole 34A having a circular shape is formed in a central portion of the bonding portion 34. The insertion hole 34A is formed to have a size that allows the second sheet 33 to be accommodated therein. The electronic components 11 mounted on the circuit board 14 are provided on the bonding portion 34 via the circuit board 14, and therefore heat of the electronic components 11 is dissipated from the heat dissipation member 24 via the bonding portion 34.

Heat Dissipation Member 24

Figure 13:
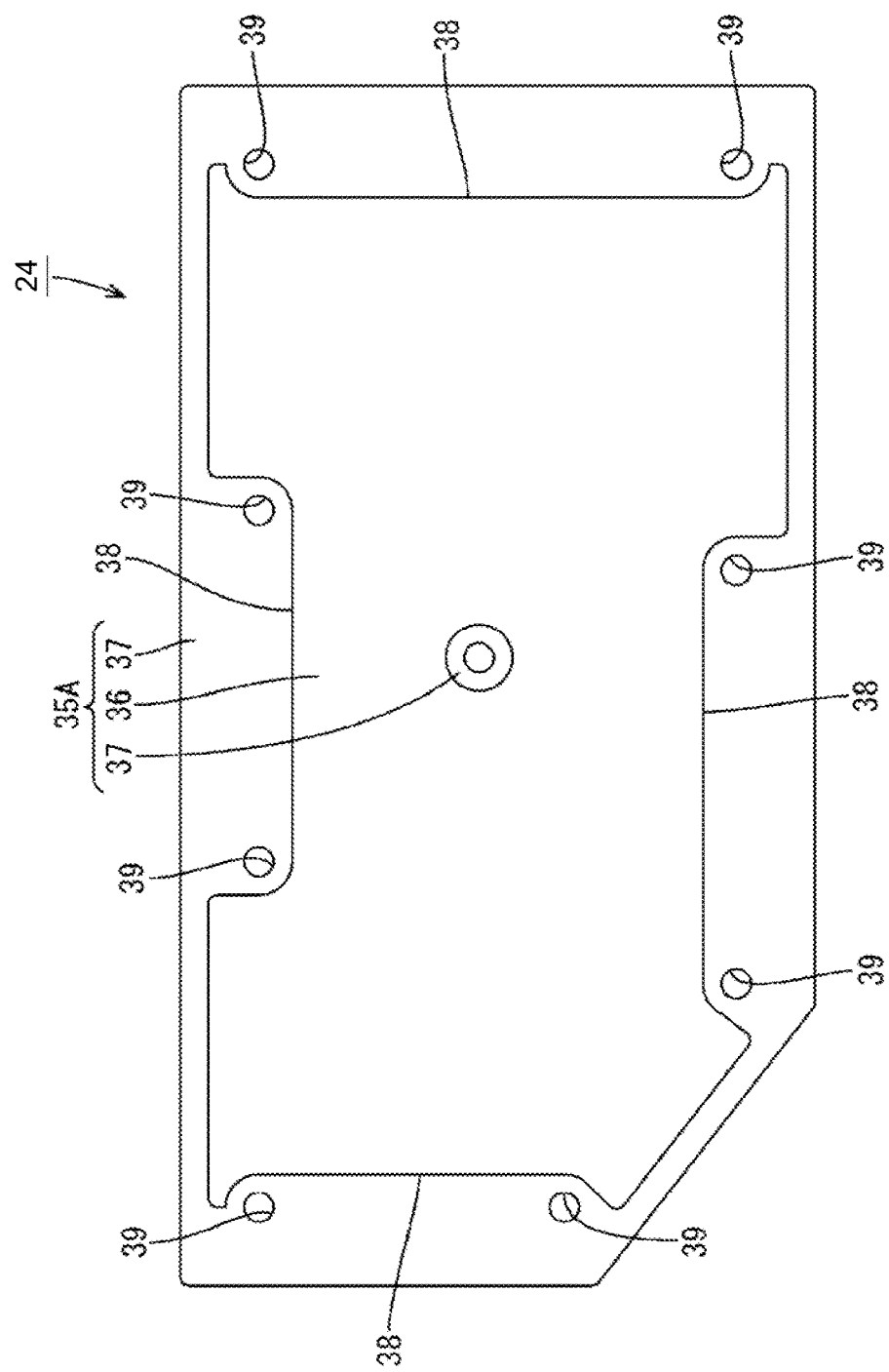
FIG. 13 is a plan view showing a heat dissipation member.
Figure 14:
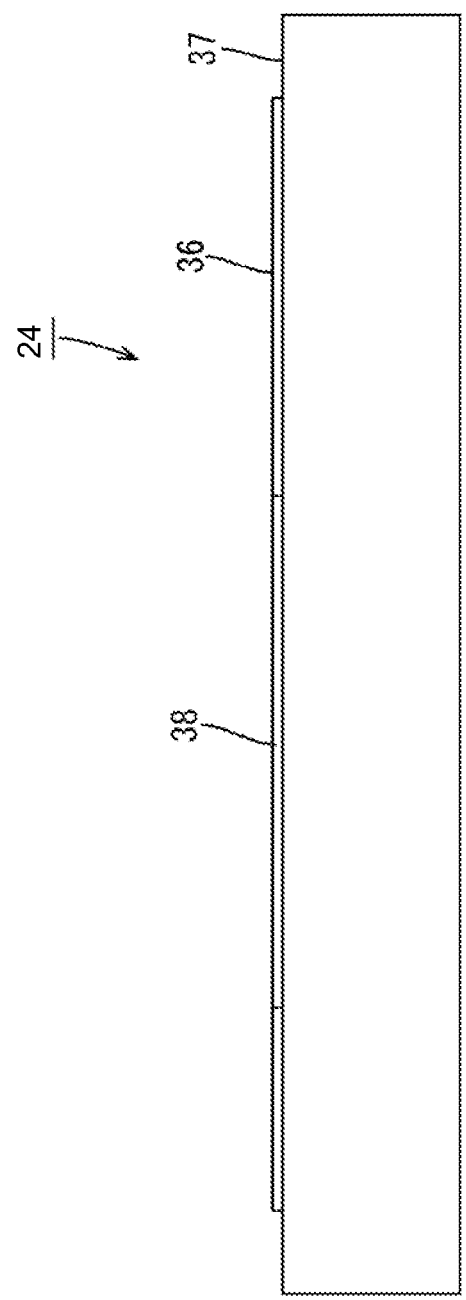
FIG. 14 is a front view showing the heat dissipation member.
Figure 15:
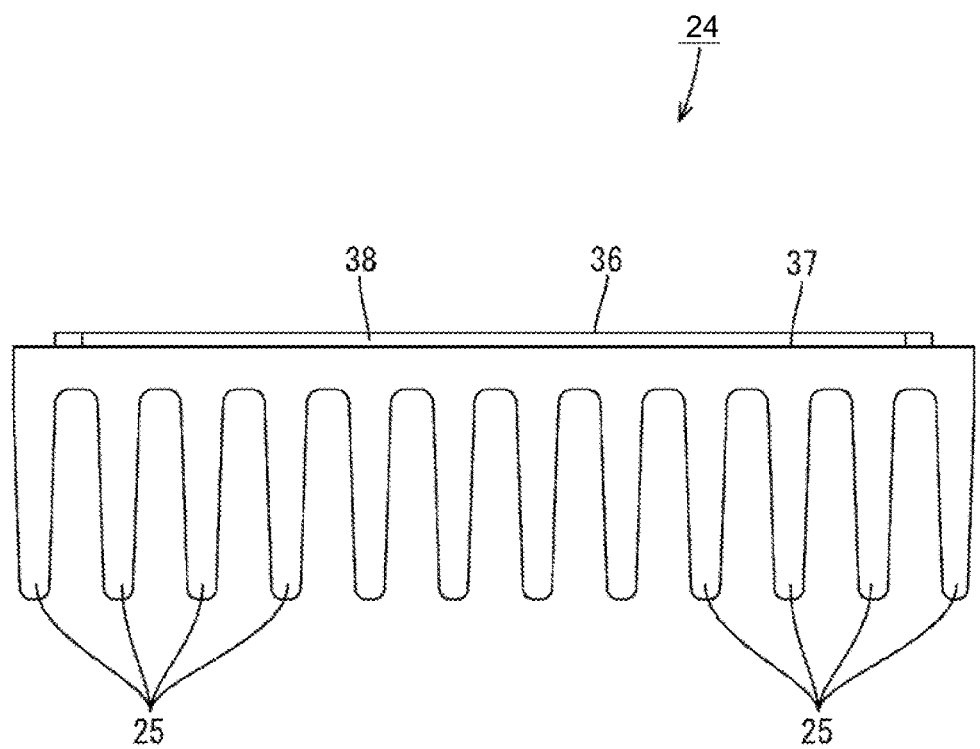
FIG. 15 is a right side view showing the heat dissipation member.

The heat dissipation member 24 is made of a metal material having high thermal conductivity, such as aluminum, an aluminum alloy, or a copper alloy. As shown in FIG. 13, only the shape of an upper surface 35A is different from that of the heat dissipation member 24 of Embodiment 1, and the heat dissipation member 24 is otherwise the same as the heat dissipation member 24 of Embodiment 1. In the upper surface 35A of the heat dissipation member 24, the protruding region 36 protruding slightly upward and recessed regions 37 provided in a central portion and on a peripheral portion side of the upper surface and recessed from the protruding region 36 in a step-like manner are formed.

The bonding portion 34 is provided over substantially the entire surface of the protruding region 36. In the recessed region 37, fitting recesses 38 in which the spacer sheet 31 can be accommodated are formed by making the protruding region 36 have a shape in which parts of peripheral edges of the protruding region 36 have been cut away.

Each fitting recess 38 extends to the protruding region 36 side so as to have a shape corresponding to the shape of a side edge of the first sheet 32 to be fitted therein. A plurality of screw holes 39 for fastening the circuit board 14 to the heat dissipation member 24 by screwing are formed in each fitting recess 38.

Figure 16:
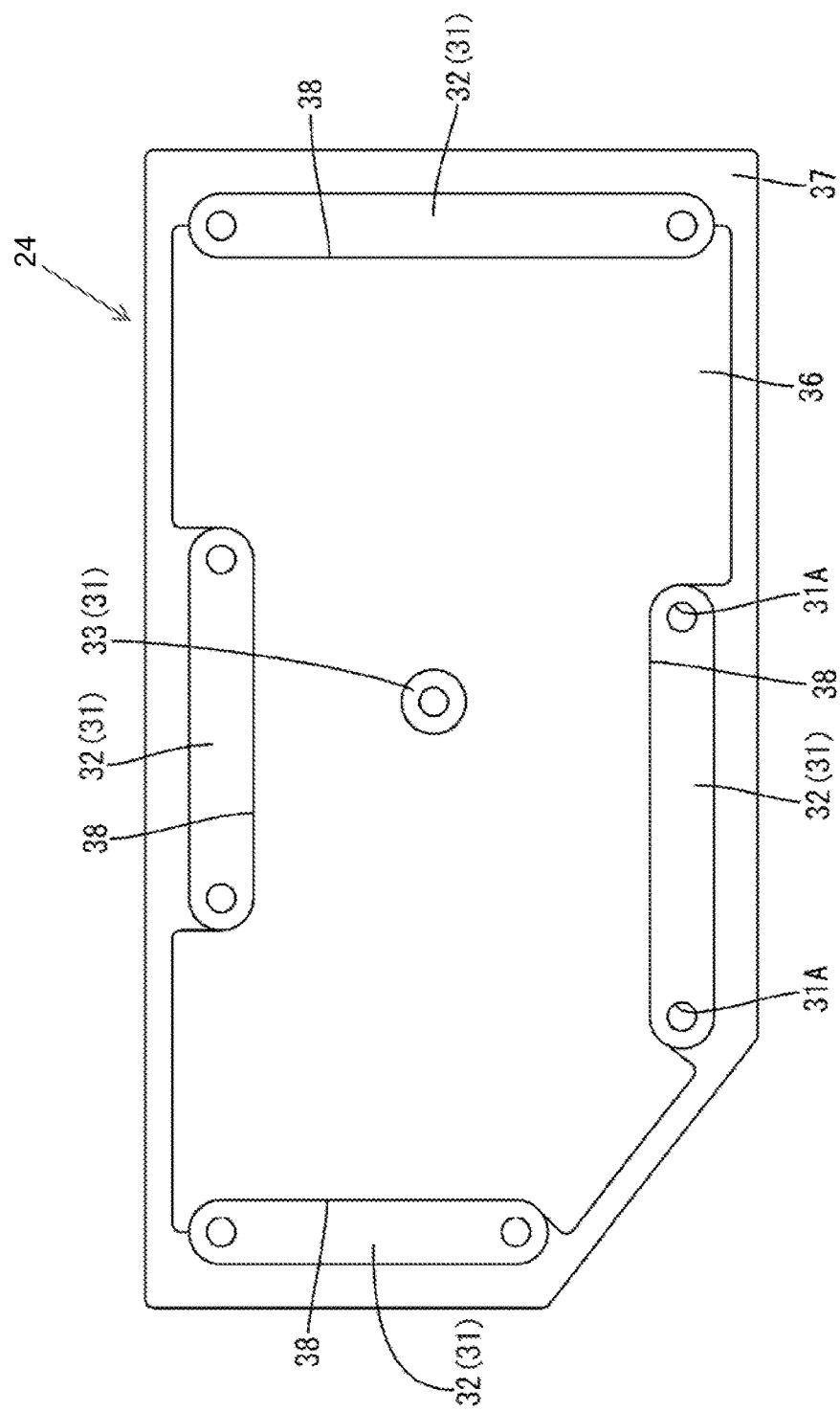
FIG. 16 is a plan view showing a state in which the spacer sheet is placed on the heat dissipation member.

When the spacer sheet 31 placed on the recessed region 37 is slid and fitted into the fitting recess 38, one side edge of the spacer sheet 31 comes into intimate contact with the step portion of the fitting recess 38, and the insertion holes 31A of the spacer sheet 31 are aligned with the respective screw holes 39 of the heat dissipation member 24 (FIG. 16).

Now, a method for manufacturing the circuit structure 30 will be described. The printed wiring board 15 and the busbar 18 are bonded to each other using an adhesive member. Moreover, the electronic components 11 are mounted on the circuit board 14 by reflow soldering, which is performed by applying a solder paste between the conductive path of the circuit board 14 and the lead terminals 13 of the electronic components 11 and passing the resultant circuit board 14 through a reflow oven.

Figure 17:
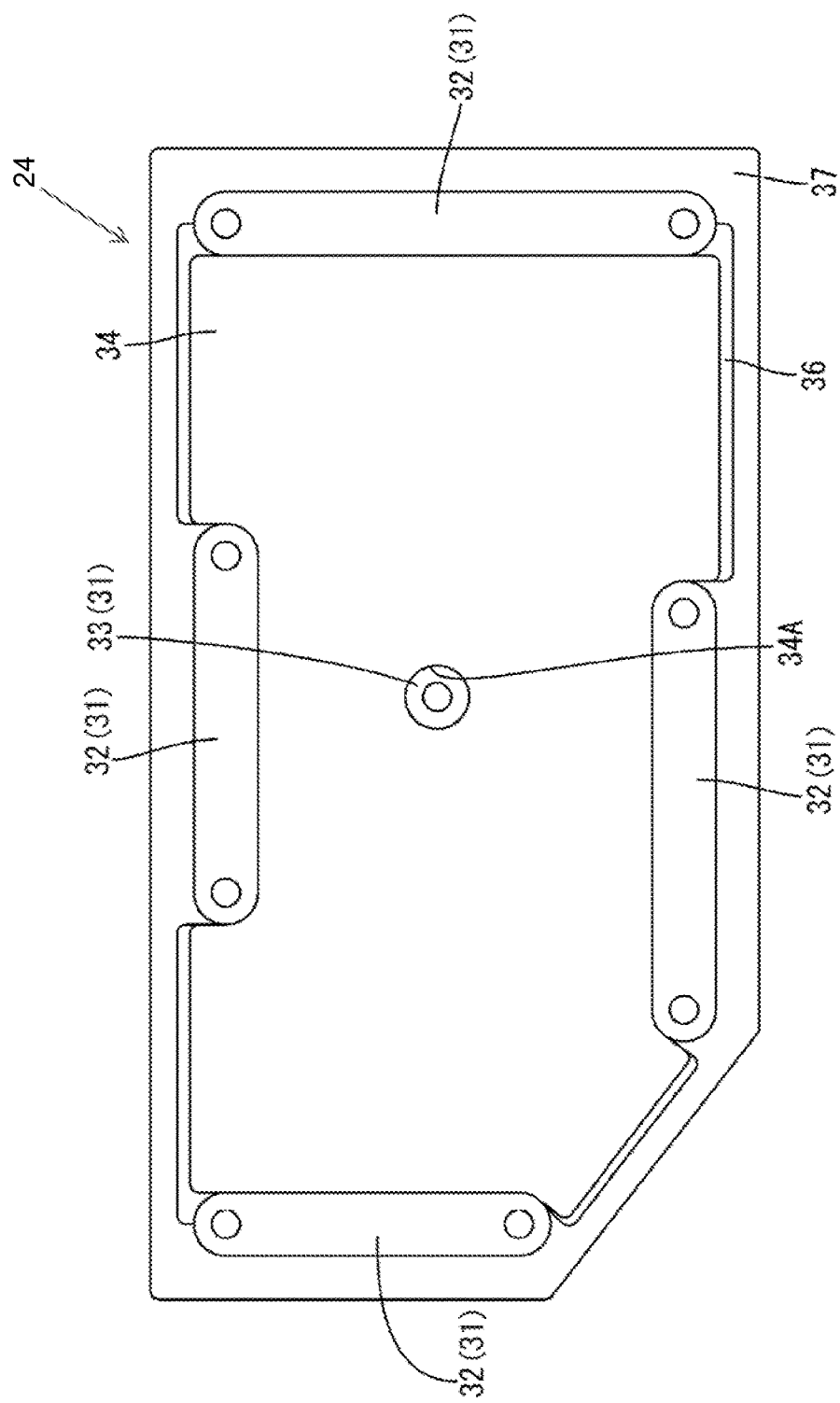
FIG. 17 is a plan view showing a state in which the spacer sheet and the bonding portion are fitted to the heat dissipation member.

Moreover, the spacer sheet 31 is fitted into the fitting recesses 38 of the heat dissipation member 24 (FIG. 16). Then, the bonding portion 34 is placed on the protruding region 36 (FIG. 17).

Next, the circuit board 14 is placed on the spacer sheet 31 and the bonding portion 34, which have been placed on the heat dissipation member 24, and the screws 40 are screwed into the fastening portions 17. The screws 40 then pass through the insertion holes 17A, 18A, and 31A and are screwed into the screw holes 26, thereby fixing the circuit board 14 and the heat dissipation member 24 to each other. Thus, the circuit structure 30 is formed.

Then, the circuit structure 30 is accommodated in a case (not shown) and provided on the path from the power source of the vehicle to the load, as an electrical junction box (not shown).

According to Embodiment 2, the following effects are achieved. The circuit structure 30 includes the electronic components 11, the circuit board 14 having the conductive path, the electronic components 11 being mounted on the circuit board 14, the heat dissipation member 24 on top of which the circuit board 14 is placed and which dissipates heat of the circuit board 14, the sheet-like spacer sheet 31 provided in a predetermined region between the circuit board 14 and the heat dissipation member 24, and the bonding portion 34 for bonding the circuit board 14 and the heat dissipation member 24 to each other, the bonding portion 34 having adhesive properties or tackiness and being provided in that region between the circuit board 14 and the heat dissipation member 24 where the spacer sheet 31 is not provided.

According to Embodiment 2, even if the circuit board 14 is pressed against the heat dissipation member 24 during bonding of the circuit board 14 and the heat dissipation member 24 to each other, the dimension between the circuit board 14 and the heat dissipation member 24 is kept at the thickness dimension of the spacer sheet 31. Thus, the pressure applied to the bonding portion 34 between the circuit board 14 and the heat dissipation member 24 can be uniformized, and therefore poor bonding between the circuit board 14 and the heat dissipation member 24 can be suppressed.

Moreover, the heat dissipation member 24 is provided with the fitting recesses 38 into which the spacer sheet 31 is fitted. With this configuration, the spacer sheet 31 can be easily disposed at a predetermined position. Furthermore, the circuit board 14 and the heat dissipation member 24 are fixed to each other by fastening with the screws 40, and the insertion holes 31A into which the screws 40 are inserted are formed in the spacer sheet 31 so as to pass through the spacer sheet 31.

With this configuration, the force generated during fastening by screwing can be received by the spacer sheet 31. Moreover, the spacer sheet 31 is provided in the peripheral portion of the region where the circuit board 14 and the heat dissipation member 24 overlap. Thus, the circuit board 14 and the heat dissipation member 24 can be firmly fixed to each other by screwing in those areas where the circuit board 14 and the heat dissipation members 24 are likely to separate from each other, and since the strong pressure generated during the screwing is received by the spacer sheet 31, the pressure applied to the bonding portion 34 can be prevented from becoming nonuniform.

The present invention is not limited to the embodiments that have been described above with reference to the drawings, and embodiments such as those described below, for example, are also included in the technical scope of the present invention.

(1) In the foregoing embodiments, the bonding portions 23, 34 are thermally conductive sheets having adhesive properties; however, the present invention is not limited to this. For example, a thermally conductive sheet having a pressure-sensitive adhesive may be used, or the circuit board 14 and the heat dissipation member 24 may be bonded to each other by applying only an adhesive or a pressure-sensitive adhesive between the circuit board 14 and the heat dissipation member 24.

(2) The adhesive is not limited to those adhesives described in the foregoing embodiments, and various types of adhesives can be used. For example, a thermosetting adhesive or a thermoplastic adhesive can be used. Moreover, in the case where a pressure-sensitive adhesive is used, various types of pressure-sensitive adhesives can be used as well. For example, adhesive tape or pressure-sensitive adhesive tape may also be used.

(3) The electronic components 11 are not limited to relays such as a mechanical relay and an FET (Field Effect Transistor), and various types of electronic components that generate heat when energized can be used.

(4) In Embodiment 1, a configuration in which the entirety of each electronic component 11 is mounted within the region of the corresponding bonding portion 23 has been described. However, the present invention is not limited to this configuration. It is also possible that each electronic component 11 is mounted in such a manner that at least a portion of the electronic component 11 overlaps the region of the corresponding bonding portion 23.

The invention claimed is:

1. A circuit structure comprising:
an electronic component;
a circuit board having a conductive path, the electronic component being mounted on the circuit board;
a heat dissipation member having an upper surface, the upper surface having a plurality of recessed regions defining a protruding region on top of which the circuit board is placed and which dissipates heat of the circuit board;
a plurality of sheet-like spacer sheets each of the plurality of sheet-like spacer sheets dimensioned to fit within a corresponding recessed region of the plurality of recessed regions so as to be disposed between the circuit board and the heat dissipation member; and
a bonding portion for bonding the circuit board and the heat dissipation member to each other, the bonding portion having adhesive properties or tackiness and being provided only on the protruding region and between the circuit board and the heat dissipation member where the spacer sheet is not provided.

2. The circuit structure according to claim 1, wherein the at least one bonding portion is a thermally conductive sheet.

3. The circuit structure according claim 2, wherein the heat dissipation member is provided with a fitting recess into which the spacer sheet is fitted.

4. The circuit structure according to claim 2, wherein the spacer sheet is provided in a peripheral portion of a region where the circuit board and the heat dissipation member overlap.

5. The circuit structure according to claim 2,
wherein the circuit board and the heat dissipation member are fixed to each other by fastening with a screw, and
an insertion hole into which the screw is inserted is formed in the spacer sheet so as to pass through the spacer sheet.

6. The circuit structure according to claim 1, wherein the heat dissipation member is provided with a fitting recess into which the spacer sheet is fitted.

7. The circuit structure according to claim 6, wherein the spacer sheet is provided in a peripheral portion of a region where the circuit board and the heat dissipation member overlap.

8. The circuit structure according to claim 6,
wherein the circuit board and the heat dissipation member are fixed to each other by fastening with a screw, and
an insertion hole into which the screw is inserted is formed in the spacer sheet so as to pass through the spacer sheet.

9. The circuit structure according to claim 1, wherein the spacer sheet is provided in a peripheral portion of a region where the circuit board and the heat dissipation member overlap.

10. The circuit structure according to claim 1,
wherein the circuit board and the heat dissipation member are fixed to each other by fastening with a screw, and
an insertion hole into which the screw is inserted is formed in the spacer sheet so as to pass through the spacer sheet.

* * * * *